(12) United States Patent
Svedberg et al.

(10) Patent No.: US 10,492,314 B2
(45) Date of Patent: Nov. 26, 2019

(54) ASSEMBLY FOR SECURING AN ELECTRONIC DEVICE TO A SUPPORT SURFACE

(71) Applicant: Axis AB, Lund (SE)

(72) Inventors: Henrik Svedberg, Lund (SE); Johan Persson, Lund (SE); Christian Jacobsson, Lund (SE); Samir Helaoui, Lund (SE)

(73) Assignee: AXIS AB, Lund (SE)

( * ) Notice: Subject to any disclaimer, the term of this patent is extended or adjusted under 35 U.S.C. 154(b) by 0 days.

(21) Appl. No.: 15/928,862

(22) Filed: Mar. 22, 2018

(65) Prior Publication Data

US 2018/0279492 A1 Sep. 27, 2018

(30) Foreign Application Priority Data

Mar. 24, 2017 (EP) .................... 17162793

(51) Int. Cl.
*H05K 5/02* (2006.01)
*F16M 11/04* (2006.01)
*H04N 5/225* (2006.01)
*H04N 7/18* (2006.01)
*G08B 13/196* (2006.01)

(Continued)

(52) U.S. Cl.
CPC ......... *H05K 5/0204* (2013.01); *F16M 11/041* (2013.01); *G08B 13/19619* (2013.01); *H04N 5/2252* (2013.01); *H04N 7/18* (2013.01); *H05K 5/0247* (2013.01); *F16M 13/02* (2013.01); *F16M 13/027* (2013.01); *G02B 6/3897* (2013.01); *G03B 17/561* (2013.01); *H01R 24/58* (2013.01); *H01R 24/64* (2013.01); *H01R 2107/00* (2013.01); *H04N 7/183* (2013.01)

(58) Field of Classification Search
CPC .......... G08B 13/19619; H05K 5/0204; H05K 5/0247; H04N 7/18; H04N 5/2252; F16M 11/041
See application file for complete search history.

(56) References Cited

U.S. PATENT DOCUMENTS

2004/0106331 A1* 6/2004 Hoegener ............ H05K 5/0017 439/701
2008/0055409 A1* 3/2008 Mars ...................... G03B 37/02 348/143

(Continued)

FOREIGN PATENT DOCUMENTS

| DE | 197 02 395 A1 | 7/1998 |
| WO | 2006/012524 A2 | 2/2006 |
| WO | 2006/012524 A3 | 2/2006 |

OTHER PUBLICATIONS

EP 17162793.8 European Search Report (dated Oct. 9, 2017).

*Primary Examiner* — Binh B Tran
*Assistant Examiner* — Douglas R Burtner
(74) *Attorney, Agent, or Firm* — Volpe and Koenig, P.C.

(57) ABSTRACT

An assembly for securing an electronic device to a support surface, comprises an anchoring unit and a mounting unit and is arranged to automatically connect the electronic device to a network when the mounting unit slides along the anchoring unit into a fully connected position. The assembly also is arranged to allow the electronic device to be securely held by the anchoring unit in an intermediate connection position without network connection.

17 Claims, 6 Drawing Sheets

(51) Int. Cl.
  *H01R 107/00* (2006.01)
  *H01R 24/64* (2011.01)
  *H01R 24/58* (2011.01)
  *G02B 6/38* (2006.01)
  *G03B 17/56* (2006.01)
  *F16M 13/02* (2006.01)

(56) References Cited

U.S. PATENT DOCUMENTS

| | | | |
|---|---|---|---|
| 2011/0255252 A1* | 10/2011 | Sloey | H04B 1/3816 |
| | | | 361/752 |
| 2013/0078855 A1* | 3/2013 | Hornick | H01R 13/73 |
| | | | 439/571 |
| 2013/0147963 A1 | 6/2013 | Henninger, III et al. | |
| 2015/0282352 A1* | 10/2015 | Ritter | G06F 1/1632 |
| | | | 361/679.01 |
| 2015/0286251 A1* | 10/2015 | Emslie | G06F 1/1632 |
| | | | 361/679.41 |
| 2016/0081207 A1* | 3/2016 | Broadbent | F16M 11/14 |
| | | | 361/807 |
| 2018/0048792 A1* | 2/2018 | Shiraishi | G03B 17/02 |
| 2019/0075197 A1* | 3/2019 | Roncetti | H05K 5/0204 |

\* cited by examiner

ASSEMBLY FOR SECURING AN ELECTRONIC DEVICE TO A SUPPORT SURFACE

FIELD OF INVENTION

The present disclosure relates to an assembly for securing an electronic device to a support surface.

BACKGROUND

There is a need to mount monitoring cameras and other large electronic devices in a ceiling or on other mounting surfaces which are located high up or difficult to access in other ways. When such devices need to be physically connected to a communication network as well as being attached to the surface by screws or similar, the installer may need to balance heavy and expensive equipment in one hand while connecting a network cable with the other; a situation which is undesirable both from a work ergonomics perspective and an efficiency point of view. A similarly cumbersome situation may arise when there is a need to temporarily physically disconnect the electronic device from the communication network, such as for maintenance purposes. There is thus room for improvements in this area.

SUMMARY

In view of the above, it would be advantageous to provide a simpler and more ergonomically friendly way of securing a network connected electronic device to a support surface.

According to a first aspect, an assembly for securing an electronic device to a support surface comprises an anchoring unit, arranged to be attached to the support surface, and includes a first mechanical mating element and a first network connection element; a mounting unit, forming a part of the electronic device, and comprising a second mechanical mating element and a second network connection element; wherein the second mating element is arranged to slide along and be guided by the first mating element, from a disconnected position into a fully connected position; wherein the first network connection element and the second network connection element are connected in the fully connected position; wherein the first mating element and the second mating element comprise mechanical engagement means for holding the first mating element and the second mating element in an intermediate connection position, provided between the disconnected position and the fully connected position; wherein the first and the second network connection element are disconnected in the intermediate connection position.

This assembly makes it possible to achieve a simplified and ergonomically friendly installation procedure when installing an electronic device, such as a monitoring camera, on a surface. The installation can be performed in steps, and the different steps can be performed by different persons with different qualifications (network technician, camera installation personnel etc.). As a first step, the anchoring unit can be mounted on the support surface, and in the next step the anchoring unit is connected to a network. Since the anchoring unit can be made much lighter than the electronic device, it will not be as difficult for the installer to position the anchoring unit correctly and to connect it to the network. During the installation of the anchoring unit, the electronic device can stay safely in its packaging or even in another location. When the electronic device is to be installed on the anchoring unit, it is lifted up so that the mechanical mating elements engage, and slid in a direction towards the fully connected position. The electronic device may, if so desired, be left safely in the intermediate connection position, without being connected to the network. During this, the weight of the electronic device is carried by the anchoring unit, not by the person performing the installation. When such configuration steps are done, the electronic device is moved (e.g., pushed) into the fully connected position and is thereby automatically connected to the network when the first and the second network connection elements are connected. This provides the advantage that no cumbersome separate connection of network connectors is needed between the anchoring unit and the support unit of the electronic device.

The electronic device may comprise a network connected device, e.g. a monitoring camera, a speaker, an illumination unit or a distance sensor, or another type of electronic device which is connected to a network via a network connection element.

The support surface may be a horizontal surface, more specifically a ceiling or a surface of a mounting platform. On such surfaces, it is advantageous that the electronic device is held by the anchoring unit early in the installation process so that the installer does not need to hold the electronic device in an uncomfortable position for a long time. Even though the advantage is more pronounced when the electronic device hangs from a support surface (such as a ceiling), there are also advantages associated with using the present invention for an electronic device which is resting on a surface. E.g., if the device is mounted in an outdoor setting, such as high up on a platform on top of a pole or pillar, there may be strong winds affecting the device, and therefore a secure hold of the electronic device in the intermediate connection position is clearly advantageous.

The support surface may alternatively be a vertical surface, and the anchoring unit is then arranged to be attached to the support surface in such manner that the first mechanical mating element will guide the second mechanical mating element in a horizontal direction. In this way the anchoring unit will also hold the weight of the electronic device in the intermediate connection position, providing the same advantage as when the support surface is a horizontal surface.

One of the first and the second mechanical mating element may comprise a flange, and the other of the first and the second mechanical mating element may comprise a bracket, thus ensuring a convenient and efficient mating between the support unit and the anchoring unit.

One of the first and the second network connection element may comprise an electronic network plug and the other of the first and the second network connection element may comprise a matching electronic network socket. A common example would be an Ethernet plug and socket connection, such as an RJ-45 plug and socket connection. Such an Ethernet connection may also be used for providing Power over Ethernet (PoE) to the electronic device.

Additionally or as an alternative, the first network connection element may comprise a first optical fiber connector and the second network connection element may comprise a matching second optical fiber connector.

In addition to a network connection, one of the first and the second network connection element may comprise an audio plug and the other of the first and the second network connection element may comprise a matching audio socket. In this way a connection for transferring sound to or from the electronic device may be automatically achieved in the same way as the network connection.

In addition to the network connection, one of the first and the second network connection element may comprise an electric plug and the other of the first and the second network connection element may comprise a matching electric socket. This may be useful in case the network connection does not provide power to the electronic device, such as when an optical fiber network is used, or when power from a PoE connection is insufficient.

The mechanical engagement means may comprise some kind of latch, e.g. in the form of a protrusion, provided in one of the first and the second mechanical mating elements, and a matching opening or cut-out provided in the other of the first and the second mechanical mating elements, wherein the latch is biased for entering the cut-out. This is a convenient and efficient way of ensuring a safe mechanical resting position in the intermediate connection position, which also allows for moving the electronic device out of the position into the fully connected position (or the disconnected position) when needed.

The anchoring unit may comprise a first locking element and the mounting unit may comprise a second locking element, wherein the first locking element and the second locking element are arranged to allow the anchoring unit and the mounting unit to be locked together in the fully connected position, and thereby securely maintain the mounting unit and the anchoring unit in the fully connected position.

The first and the second locking elements may comprise at least one of: a nut and bolt connection, or a screw and threaded hole connection.

In addition, a biasing element for biasing the mounting unit from the fully connected position towards the intermediate connection position may be provided. In this way, the installer will be helped in moving the assembly from the fully connected position into the intermediate connection position.

The biasing element may comprise an elastic element in the form of a spring or a compressible material.

The first mechanical mating element may comprise a tapered introduction section, arranged to aid in guiding the second mechanical mating element into engagement with the first mechanical mating element. This further simplifies the installation of the electronic device on the anchoring unit.

Generally, all terms used in the claims are to be interpreted according to their ordinary meaning in the technical field, unless explicitly defined otherwise herein. All references to "a/an/the [device, member, parameter, step etc.]" are to be interpreted openly as referring to at least one instance of said device, member, parameter, step etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present teachings, will be better understood through the following illustrative and non-limiting detailed description of preferred embodiments of the present invention, with reference to the appended drawings, where the same reference numerals will be used for similar elements, wherein.

DETAILED DESCRIPTION OF EMBODIMENTS

Figure 1:
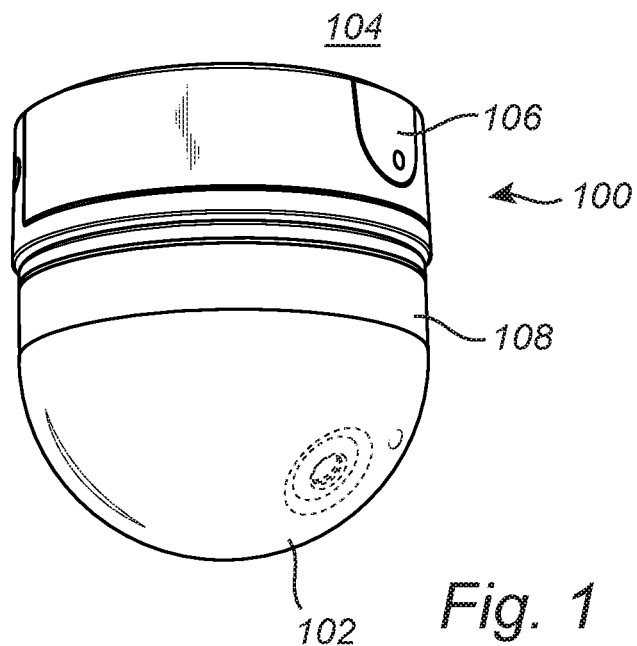
FIG. 1 shows the assembly securing the electronic device to a support surface in a perspective view, in the fully connected position.

FIG. 1 shows an assembly 100 for securing an electronic device 102 to a support surface 104. The assembly 100 includes an anchoring unit 106, which is attached to the support surface 104, and a mounting unit 108, which usually is a part of the electronic device 102. The electronic device 102 may be a monitoring camera, such as a monitoring camera with a PTZ motor included, or it may be a speaker, an illumination unit or a distance sensor, such as a radar or laser unit, or it may include a combination of any of these or other network connected devices.

Figure 2:
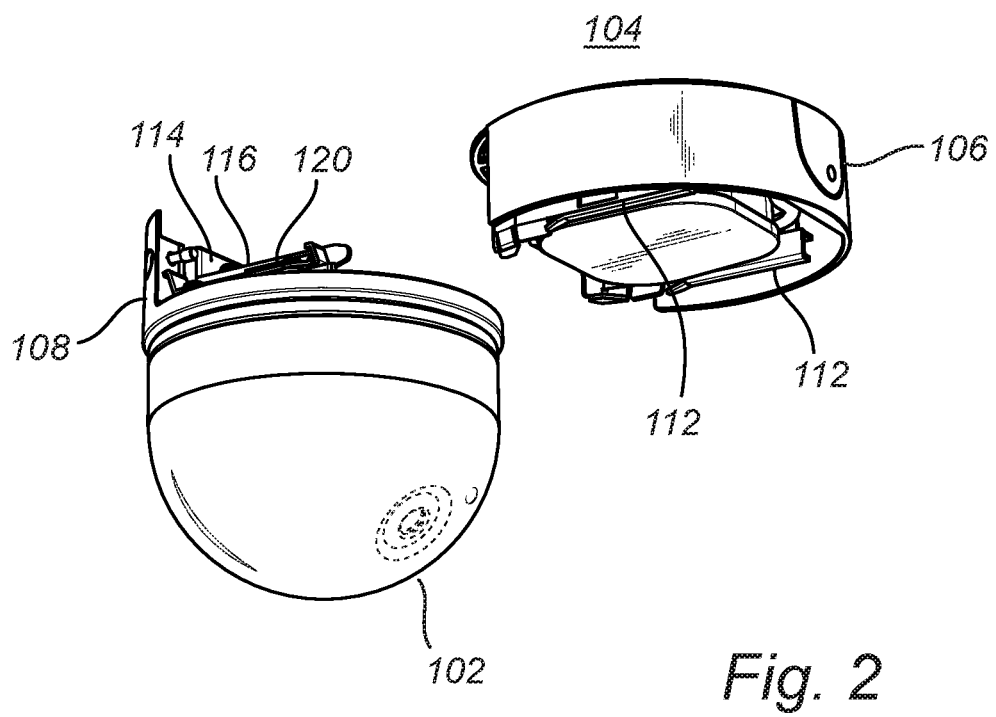
FIG. 2 shows the assembly and the electronic device in the disconnected position.
Figure 3:
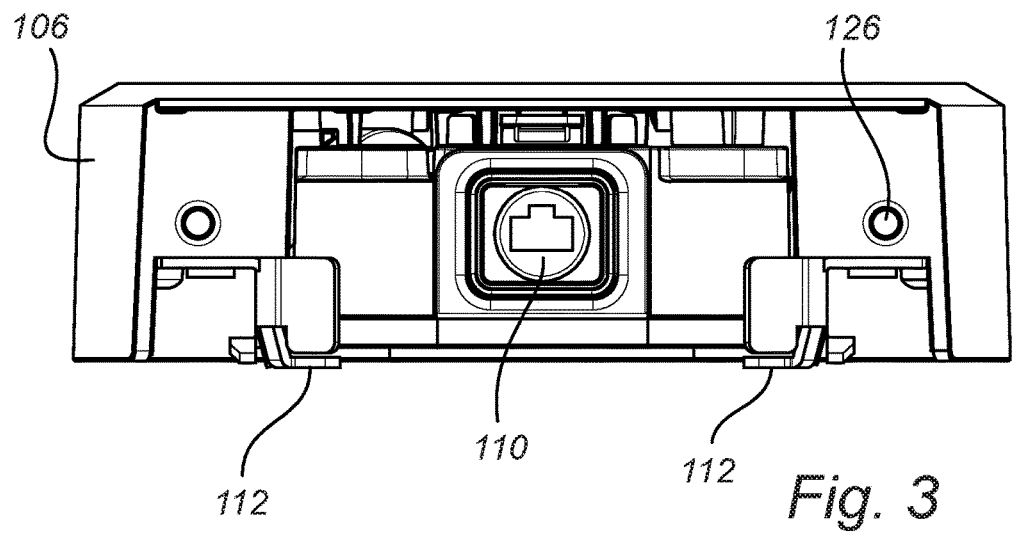
FIG. 3 is a view from the front of the anchoring unit.
Figure 4:
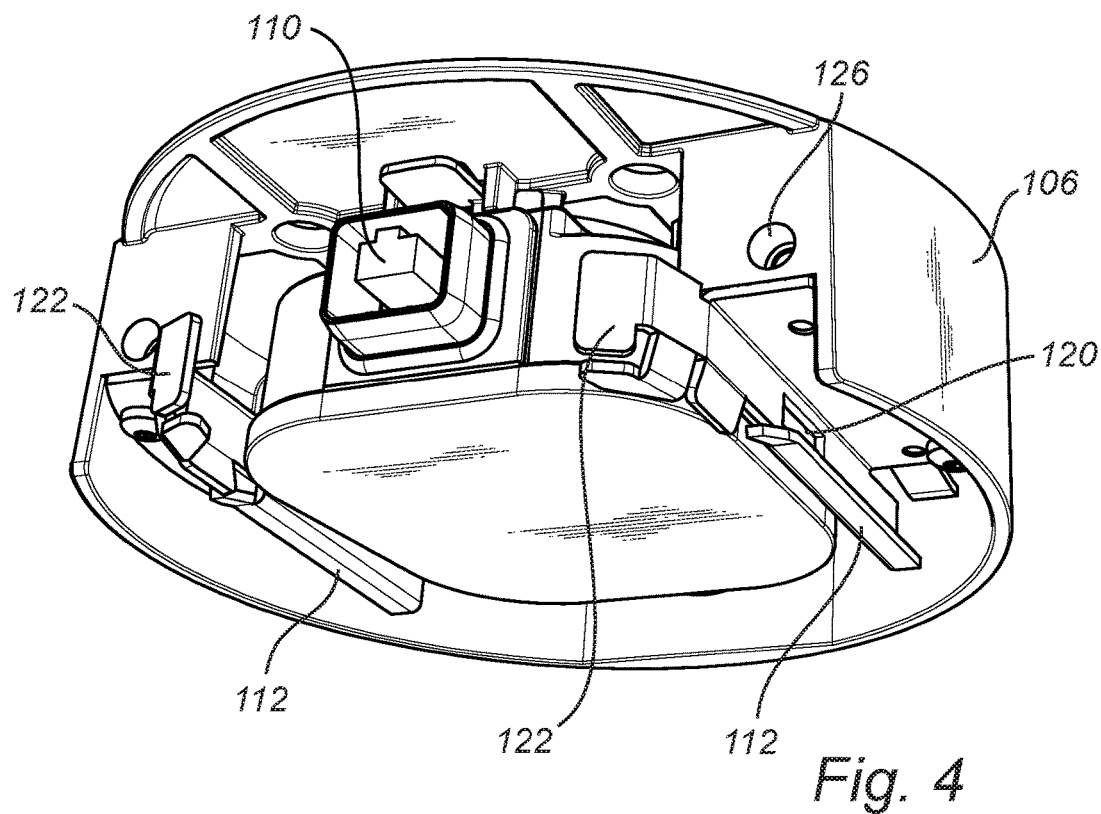
FIG. 4 shows the anchoring unit in a perspective view.
Figure 5:
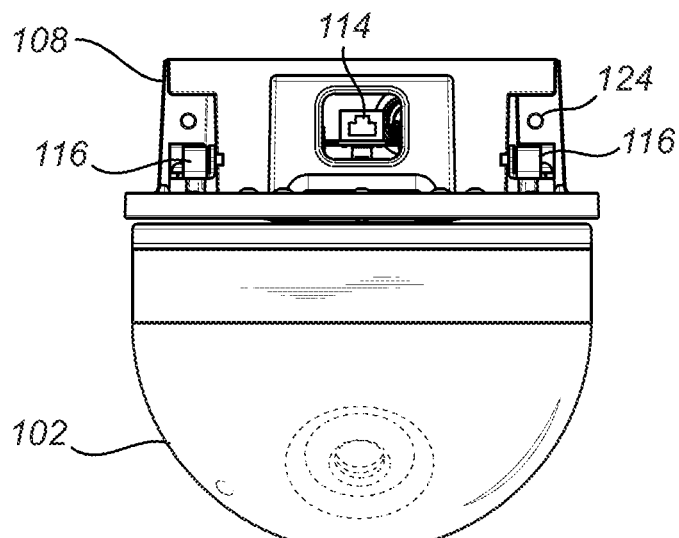
FIG. 5 shows the electronic device with its mounting unit from the front.
Figure 6:
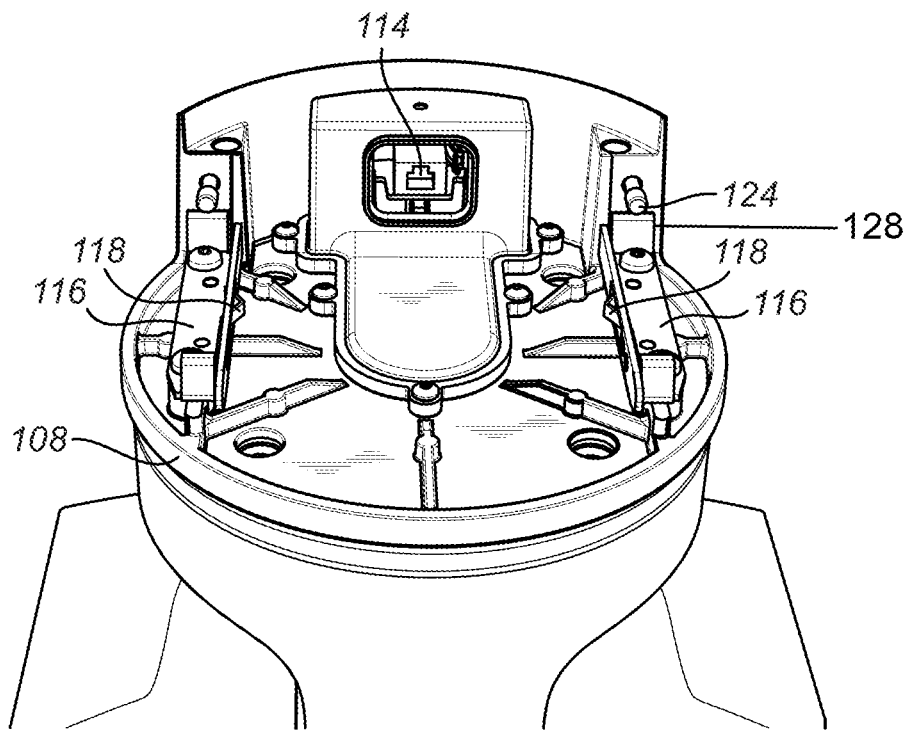
FIG. 6 shows the mounting unit in a perspective view from the side facing the anchoring unit.

As shown in FIGS. 2-4, the anchoring unit 106 has a first network connection element 110, and a first mechanical mating element 112, exemplified in the form of a pair of brackets 112. As shown in FIGS. 2 and 5-6 the mounting unit 108 has a second network connection element 114, which matches the first network connection element 110, and a second mechanical mating element 116, exemplified in the form of a pair of flanges 116, matching the brackets 112.

The first and second mechanical mating elements 112, 116 may be of any design suitable for allowing the mounting unit 108 to slide in a secure and well defined manner in relation to the anchoring unit 106, and may e.g., include rails provided as one of the first and the second mating elements and matching elongated openings or tracks as the other of the first and second mechanical mating elements.

The network connection elements 110 and 114 can be in the form of any two matching network connections, such as an electronic network plug and socket connection, e.g., in the form of an Ethernet plug and matching socket, such as an RJ-45 plug and jack, which also may provide a Power over Ethernet connection to the electronic device, or matching optic fibre network connectors. In addition, the network connection elements may comprise further connection possibilities, such as audio connectors, e.g., in the form of an audio plug and socket combination, or connectors for providing electric power, e.g., in the form of an electric plug and socket combination.

In FIG. 1, the assembly 100 with the electronic device 102 is shown in a fully connected position, where the mounting unit 108 is mounted on the anchoring unit 106, and the electronic device 102 thereby is connected to a network, via the first and second network connection elements 110 and 114, which are connected to each other.

In FIG. 2, the assembly 100 with the electronic device 102 is shown in a disconnected position. The anchoring unit 106 is shown attached to the support surface 104, and the electronic device 102 with its mounting unit 108 is e.g., held by a person who is in the process of installing the electronic device 102.

At the installation of the electronic device 102, the anchoring unit 106 is first attached to the support surface 104, and connected to the network e.g., via a standard network cable connection (not shown). The second mechanical mating element 116 is then positioned in contact with, and aligned with the open end of the first mechanical mating element 112, and the electronic device 102 with the mounting unit 108 is pushed towards the first network connection element 110, whereby the second mechanical mating element 116 slides along and is guided by the first mechanical mating element 112 until the second network connection element 114 is connected to the first network connection element 110 and the fully connected position is reached.

In order to simplify the mutual initial positioning of the mechanical mating elements 112 and 116, the second mechanical mating 116 element may have a tapered or slanted introduction section 122 which aids in guiding the first mechanical mating element 112 into contact with the second mechanical mating element 116.

It may be noted that the support surface 104 is illustrated as being a mainly horizontal surface (such as a ceiling) from which the electronic device 102 is suspended. The support surface 104 may also be a surface on which the electronic device 102 rests, such as a surface of a mounting platform, e.g., on top of a pole, pillar or similar. The support surface 104 may also be a vertical surface, such as a wall, as illustrated in FIGS. 9-12. In the latter case, the mechanical mating elements are preferably aligned in a horizontal direction, in order for them to be able to easily hold the electronic device 102.

As the inventors have realized, there are situations where it is desirable to maintain a mechanical connection between the anchoring unit 106 on one hand and the electronic device 102 with the mounting unit 108 on the other, while at the same time not connecting the electronic device 102 to the network. Such a situation might e.g., occur during installation, when the installer needs to check something and would like to leave the electronic device 102 safely suspended by the anchoring unit 106, without initializing a network connection. Another situation is when a hard reset of the electronic device 102 is needed, and the network connection (and possibly the power supply) needs to be broken. In this case it would also be advantageous if the anchoring unit 106 can continue to securely support the electronic device 102.

Figure 7:
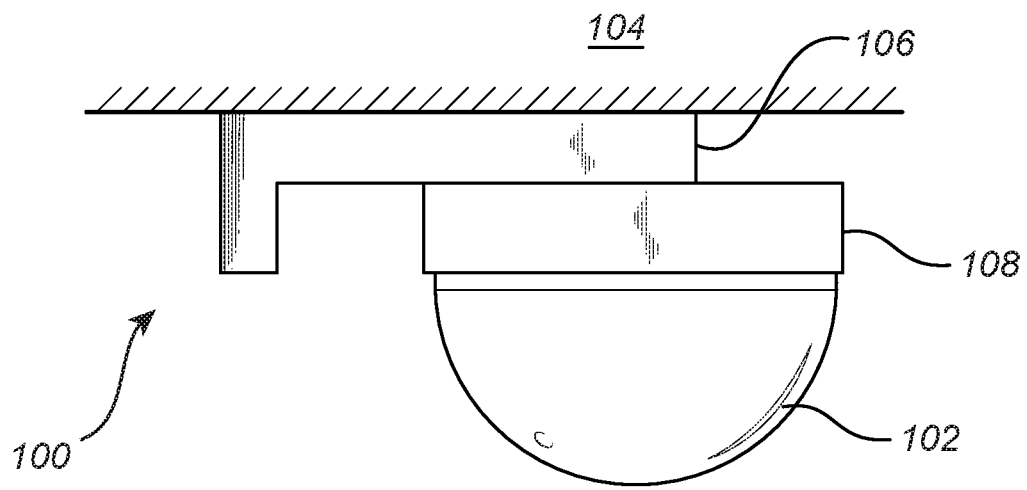
FIG. 7 shows the assembly and the electronic device in the intermediate connection position when suspended from a horizontal support surface.
Figure 9:
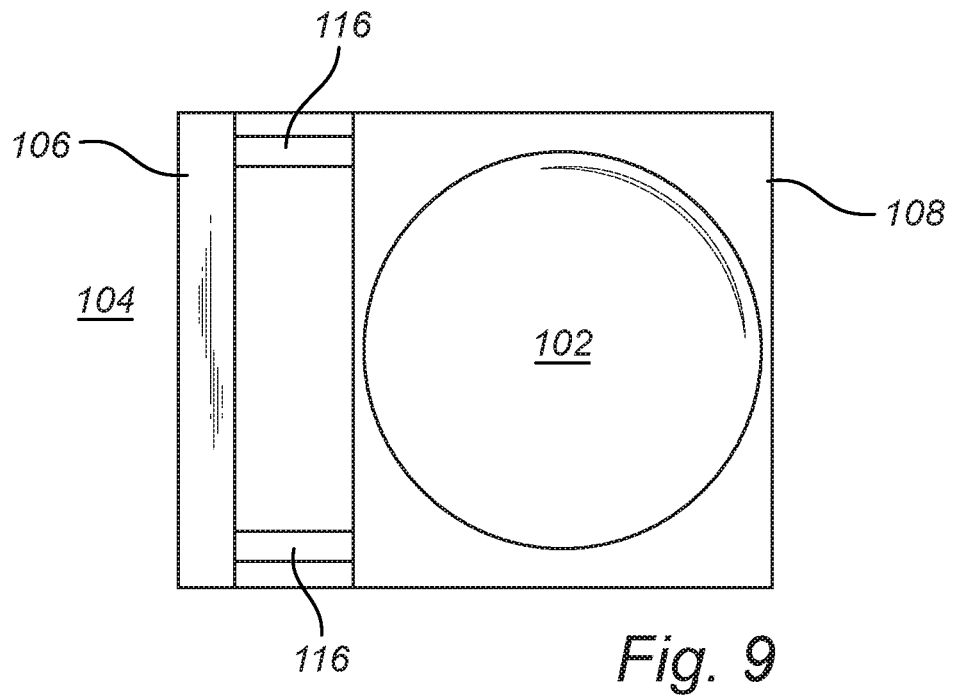
FIG. 9 shows the assembly and the electronic device in the intermediate connection position, when mounted on a vertical support surface.
Figure 10:
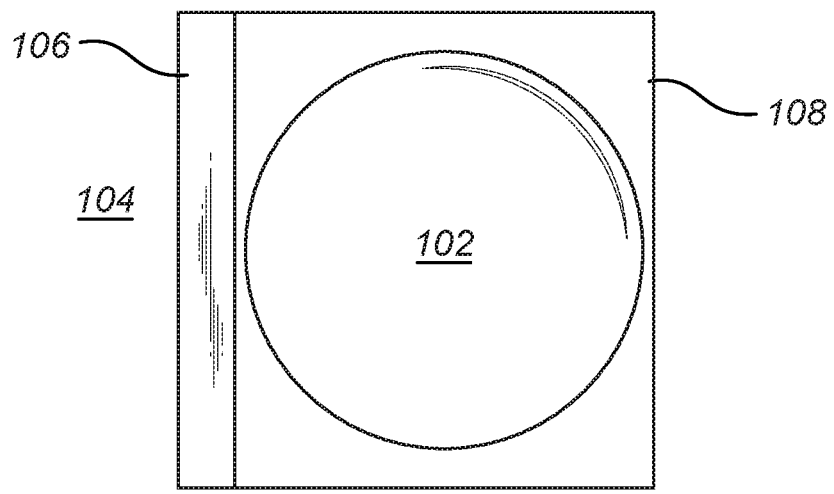
FIG. 10 shows the assembly and the electronic device of FIG. 9 in the fully connected position.
Figure 11:
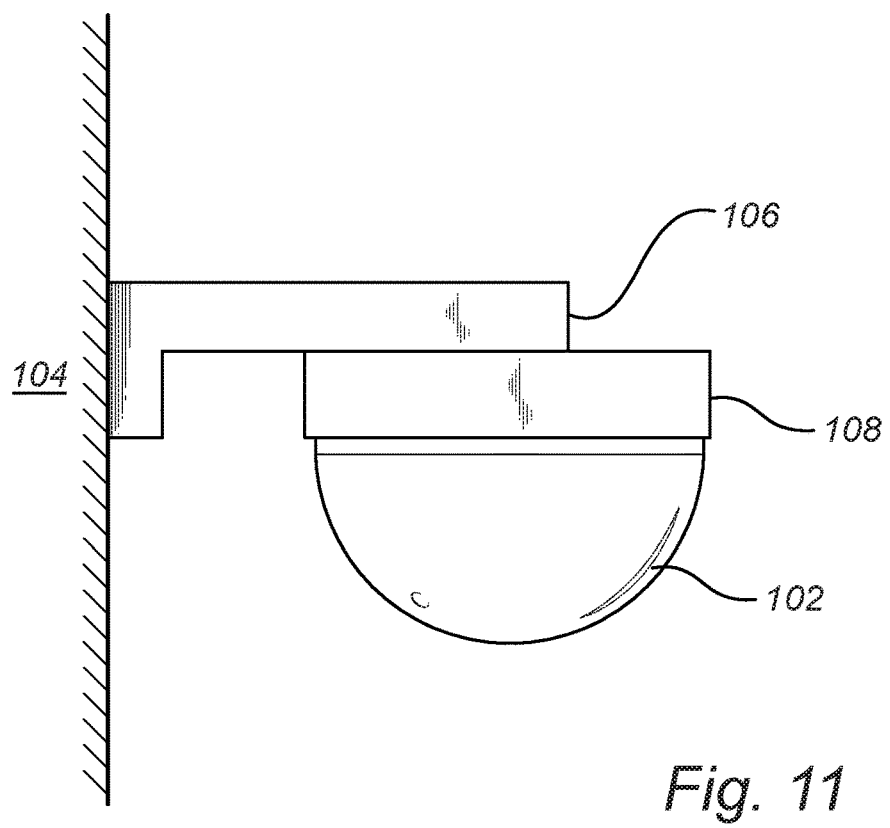
FIG. 11 shows the assembly and the electronic device in the intermediate connection position when mounted in another manner on a vertical support surface.
Figure 12:
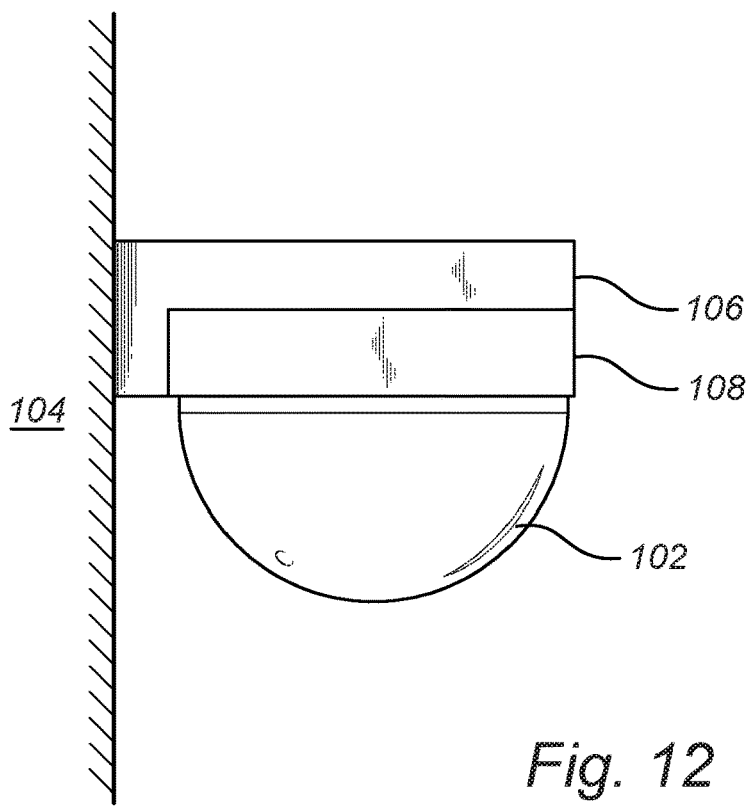
FIG. 12 shows the assembly and the electronic device of FIG. 11 in the fully connected position.

For this purpose, i.e., in order to achieve a mechanical connection in a network disconnected state, the assembly 100 comprises mechanical engagement means 118, 120 providing an intermediate connection position wherein the electronic device is held stably and safely, i.e. where the support unit 108 and the anchoring unit 106 will not move easily in relation to each other, unless a force is applied. The mechanical engagement means are exemplified as a projection(s), protrusion(s) or latch(es) 118, provided in the second mechanical mating element 116 and a matching depression(s), opening(s) or cut-out(s) 120 which is provided in the first mechanical mating element 112. Obviously, the cut-out 120 can be provided in the second mechanical mating element 116 instead and the latch 118 in the first mechanical mating element 112. The latch 118 is in some way biased for entering the cut-out 120. The biasing action may e.g., be provided by the mechanical mating elements being slightly elastic, with the latch 118 being pressed towards the mating element comprising the cut-out 120, such that the latch 118 will automatically enter the cut-out 120 when the latch 118 and the cut-out 120 becomes aligned with each other during the sliding motion of the mounting unit 108 in relation to the anchoring unit 106. The intermediate connection position is illustrated in FIG. 7. FIGS. 9-12 show the intermediate connection position (FIGS. 9 and 11) and the fully connected position (FIGS. 10 and 12) for two variants when the electronic device is mounted on a wall, or another mainly vertical support surface 104. In FIGS. 9-10, the anchoring unit 106 is mounted on the wall similar to the manner in which it is mounted on a ceiling, i.e. the electronic device 102 and the support unit 108 is moved in a horizontal direction alongside the support surface 104 when being transferred from the unconnected position to the intermediate connection position and to the fully connected position. In FIGS. 11-12 the anchoring unit 106 is instead mounted in a manner where the electronic device 102 with the support unit 108 is moved in a horizontal direction towards the support surface 104, when being transferred from the unconnected position to the intermediate connection position and finally into the fully connected position.

Figure 8:
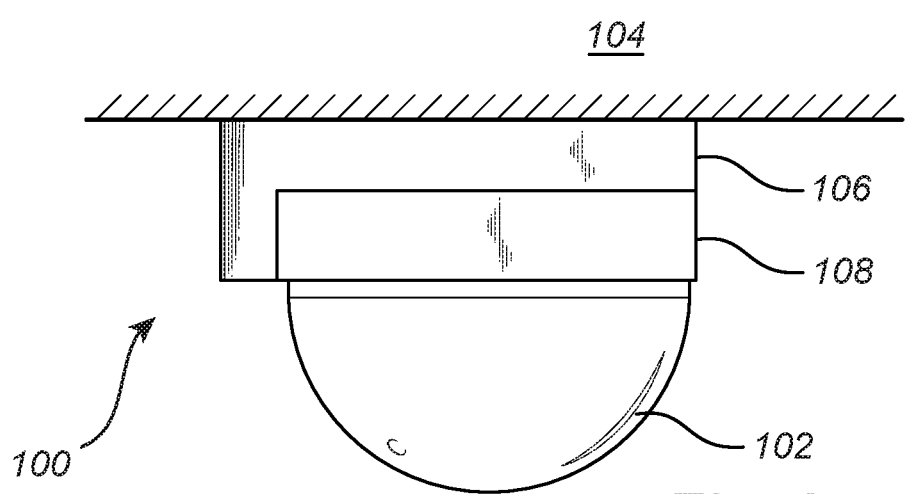
FIG. 8 shows the assembly and the electronic device in the fully connected position.

Thus, when the electronic device 102 is pushed from the disconnected position into the fully connected position, it will move into, and then, but only if the installer desires, pass the intermediate connection position. The latch 118 will slide into the cut-out 120, and then, if the installer is ready to connect the electronic device 102, by giving the electronic device 102 a slightly more powerful push, the latch 118 will then slide out of the cut-out 120 and the electronic device 102 will move into the fully connected position, as illustrated in FIGS. 8, 10 and 12, and the network connection elements will be automatically connected to each other, thereby connecting the electronic device 102 to the network.

When there is a need to disconnect the electronic device 102 from the network without removing it from the support surface, the installer may move the electronic device 102 from the fully connected position (e.g., by pulling it away from this position), and then allow it to rest securely in the intermediate connection position. When the installer is ready to reconnect the electronic device 102 to the network, it can be moved back into the fully connected position (e.g., by pushing it back).

The assembly 100 may also include locking elements 124, 126 provided in the mounting unit 108 and the anchoring unit 106, for securely maintaining them in the fully connected position and avoiding inadvertently moving them in relation to each other out of the fully connected position. Such locking elements may e.g., be provided in the form of screws 124 being screwed into threaded holes 126, or in the form of a nut and bolt connection.

The provision of such locking elements also provides for the possibility of adding a biasing element 128 arranged to bias the mounting unit in a direction away from the fully connected position and into the intermediate connection position. When such is provided, the installer wishing to disconnect the electronic device will only need to unlock, or release, the locking elements, and the electronic device will then easily slide out of the fully connected position into the intermediate connection position, being pushed by the biasing force of the biasing element 128. The biasing element 128 may e.g., be provided in the form of an elastic element, such as a compressed spring or an element made by a compressible (and elastic) material.

In summary, an assembly for securing an electronic device to a support surface comprises an anchoring unit and a mounting unit and is arranged to automatically connect the electronic device to a network when the mounting unit slides along the anchoring unit into a fully connected position. The assembly also is arranged to allow the electronic device to be securely held by the anchoring unit in an intermediate connection position without network connection.

It will be appreciated that a person skilled in the art can modify the above-described embodiments in many ways and still use the advantages of the invention as shown in the embodiments above. Thus, the invention should not be limited to the shown embodiments but should only be defined by the appended claims. Additionally, as the skilled person understands, the shown embodiments may be combined.

LIST OF REFERENCE NUMERALS

100 Assembly
102 Electronic device
104 Support surface
106 Anchoring unit
108 Mounting unit
110 First network connection element
112 First mechanical mating element
114 Second network connection element
116 Second mechanical mating element
118 Mechanical engagement means
120 Mechanical engagement means
122 Introduction section
124 First locking element
126 Second locking element

What is claimed is:

1. An assembly for securing an electronic device to a support surface, comprising:
   an anchoring unit, arranged to be suspended from the support surface, and comprising a first mechanical mating element and a first network connection element,
   a mounting unit, forming a part of the electronic device, and comprising a second mechanical mating element and a second network connection element,
   wherein the second mating element is arranged to slide along and be guided by the first mating element, from a disconnected position into a fully connected position,
   wherein the first network connection element and the second network connection element are connected in the fully connected position,
   wherein the first mechanical mating element and the second mechanical mating element comprise mechanical engagement means for holding the first mechanical mating element and the second mechanical mating element in an intermediate connection position, provided between the disconnected position and the fully connected position,
   wherein the mounting unit is suspended from the anchoring unit in the intermediate connection position; and
   wherein the first and the second network connection elements are disconnected in the intermediate connection position.

2. The assembly of claim 1, wherein the electronic device comprises a network connected device such as a monitoring camera, a speaker, an illumination unit or a distance sensor.

3. The assembly of claim 1, wherein the support surface is a horizontal surface.

4. The assembly of claim 1, wherein the support surface is a vertical surface, and wherein the anchoring unit is arranged to be suspended from the support surface in such manner that the first mechanical mating element will guide the second mechanical mating element in a horizontal direction.

5. The assembly of claim 1, wherein one of the first and the second mechanical mating element comprises a flange, and the other of the first and the second mechanical mating element comprises a bracket.

6. The assembly of claim 1, wherein one of the first and the second network connection element comprises an electronic network plug and the other of the first and the second network connection element comprises a matching electronic network socket.

7. The assembly of claim 1, wherein the first network connection element comprises a first optical fiber connector and the second network connection element comprises a matching second optical fiber connector.

8. The assembly of claim 1, wherein one of the first and the second network connection element comprises an audio plug and the other of the first and the second network connection element comprises a matching audio socket.

9. The assembly of claim 1, wherein one of the first and the second network connection element comprises an electric plug and the other of the first and the second network connection element comprises a matching electric socket.

10. The assembly of claim 1, wherein the mechanical engagement means comprises a latch provided in one of the first and the second mechanical mating elements, and a matching cut-out provided in the other of the first and the second mechanical mating elements, wherein the latch is biased for entering the cut-out.

11. The assembly of claim 1, wherein the anchoring unit comprises a first locking element and the mounting unit comprises a second locking element, wherein the first locking element and the second locking element are arranged to allow the anchoring unit and the mounting unit to be locked together in the fully connected position, and thereby securely maintain the mounting unit and the anchoring unit in the fully connected position.

12. The assembly of claim 11, wherein the first and the second locking elements comprise at least one of: a nut and bolt connection, or a screw and threaded hole connection.

13. The assembly of claim 11, further comprising a biasing element for biasing the mounting unit from the fully connected position towards the intermediate connection position.

14. The assembly of claim 12, further comprising a biasing element for biasing the mounting unit from the fully connected position towards the intermediate connection position.

15. The assembly of claim 13, wherein the biasing element comprises an elastic element in the form of a spring or a compressible material.

16. The assembly of claim 14, wherein the biasing element comprises an elastic element in the form of a spring or a compressible material.

17. The assembly of claim 1, wherein the first mechanical mating element comprise a tapered introduction section, arranged to aid in guiding the second mechanical mating element into engagement with the first mechanical mating element.

* * * * *

UNITED STATES PATENT AND TRADEMARK OFFICE
CERTIFICATE OF CORRECTION

PATENT NO. : 10,492,314 B2
APPLICATION NO. : 15/928862
DATED : November 26, 2019
INVENTOR(S) : Svedberg et al.

Page 1 of 1

It is certified that error appears in the above-identified patent and that said Letters Patent is hereby corrected as shown below:

On the Title Page

Item [72], delete "Christian Jacobsson" and insert therefor --Christian Jakobsson--.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*